United States Patent [19]

Plies

[11] Patent Number: 4,769,543
[45] Date of Patent: Sep. 6, 1988

[54] SPECTROMETER LENS FOR PARTICLE BEAM APPARATUS

[75] Inventor: Erich Plies, Munich, Fed. Rep. of Germany

[73] Assignee: Siemens Aktiengesellschaft, Berlin and Munich, Fed. Rep. of Germany

[21] Appl. No.: 23,857

[22] Filed: Mar. 9, 1987

[30] Foreign Application Priority Data

Mar. 7, 1986 [DE] Fed. Rep. of Germany ....... 3607553

[51] Int. Cl.[4] ............................................. H01J 49/00
[52] U.S. Cl. ................................... 250/310; 250/305; 250/396 R; 250/396 ML
[58] Field of Search ................ 250/310, 397, 396 ML, 250/305

[56] References Cited

U.S. PATENT DOCUMENTS

| | | | |
|---|---|---|---|
| 3,930,181 | 12/1975 | Pfeiffer | 250/396 ML |
| 4,019,989 | 4/1977 | Hazewindus et al. | 250/396 ML |
| 4,395,691 | 7/1983 | Knauer | 250/396 ML |
| 4,464,571 | 8/1984 | Plies | 250/305 |
| 4,590,379 | 5/1986 | Martin | 250/396 ML |
| 4,658,136 | 4/1987 | Ohtaka et al. | 250/396 R |
| 4,684,808 | 8/1987 | Plies et al. | 250/396 ML |

FOREIGN PATENT DOCUMENTS

| | | | |
|---|---|---|---|
| 485446 | 10/1975 | Australia | 250/396 ML |
| 3521464 | 6/1985 | Fed. Rep. of Germany | |
| 241812 | 12/1986 | Fed. Rep. of Germany | 250/396 R |

OTHER PUBLICATIONS

"Proceedings of the Symposium on Electron Beam Testing", Nov. 9–10, Osaka, Japan, pp. 69–72.
K. H. Herrmann et al "The Design of Compact Deflection Coils and Their Application to a Minimum Exposure System", 6th European Congress on Electron Microscopy, Jerusalem, 1976, pp. 342 and 343.
Co-pending U.S. Patent Application, Feurbaum et al., No. 874,498.

Primary Examiner—Carolyn E. Fields
Assistant Examiner—John A. Miller
Attorney, Agent, or Firm—Hill, Van Santen, Steadman & Simpson

[57] ABSTRACT

A spectrometer-lens for particle beam apparatus is formed by a short focal length magnetic lens having an integrated electrostatic retarding field spectrometer and a single-stage deflection unit arranged within said lens. To avoid deflecting secondary particles that are triggered at a specimen by a primary particle beam, nearly uniform electrical and magnetic deflection fields are generated by the deflection unit oriented relative to one another such that their field vectors reside perpendicular to one another and respectively perpendicular to a velocity vector of the secondary particles attracted from the specimen.

21 Claims, 4 Drawing Sheets

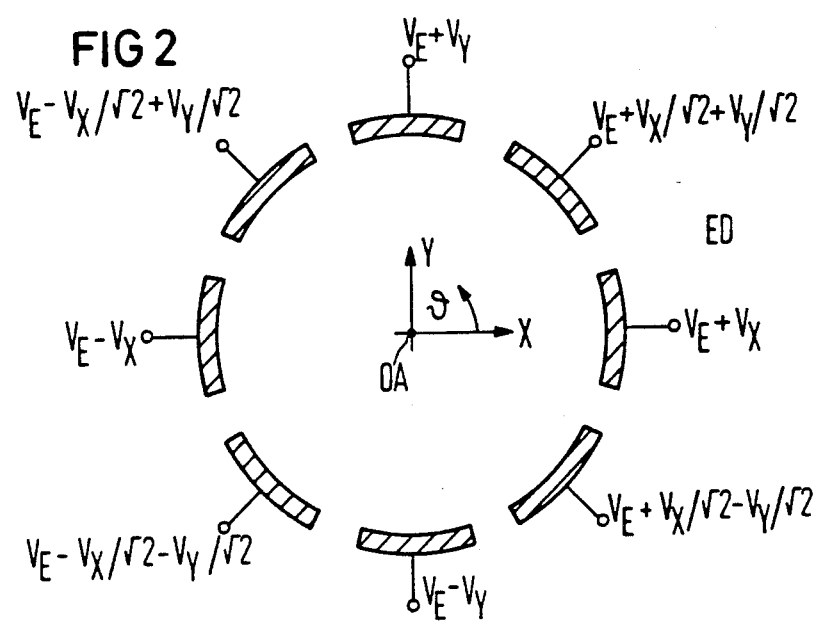
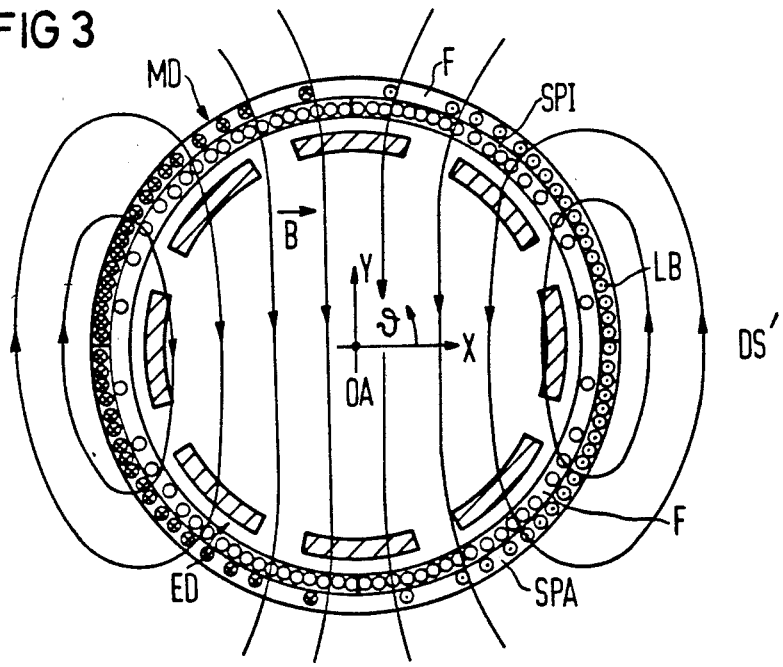

SPECTROMETER LENS FOR PARTICLE BEAM APPARATUS

BACKGROUND OF THE INVENTION

1. Field of the Invention

The present invention relates generally to a spectrometer lens having a magnetic lens, a deflection unit, and a retarding field spectrometer for particle beam measurements through analysis of secondary particles.

2. Description of the Related Art

Conventional scanning electron microscopes which are equipped with beam blanking systems and retarding field spectrometers are currently used for quantitative measurements of potential at nodes and interconnects in LSI (large scale integrated) circuits. However, it is not possible to generate sufficiently fine electron probes for investigating VLSI (very large scale integrated) circuits having structures in the submicrometer range using modified scanning electron microscopes, since the electron microscopes must be operated at low accelerating voltages to avoid radiation damage as well as charging of the components which are usually mounted on non-conductive or poorly conductive carrier substances.

Spatial resolution by the known scanning electron microscopes is essentially limited by the axial chromatic aberration of the objective lens and by the electron-electron interaction, or Boersch effect. A clear improvement of the spatial resolution can be achieved only by using a short electron-optical beam path having few beam cross overs and by using an objective lens of short focal length. The use of short focal length objective lenses to reduce chromatic and spherical aberrations essentially defined by the focal length have hi-thereto failed due to the structure of conventional electron beam measuring units which include a secondary electron spectrometer disposed between the objective lens and the specimen under test.

Only due to the development of objective lenses having integrated secondary electron spectrometers, also known as spectrometer-objectives, could the aberration of the objective lens and, thus, the probe diameter at the specimen be reduced together with the working distance. The spectrometer-objective is known from the publication of Kawamoto "Electron Beam Tester with in the Lens Analyzer" which appear in the Proceedings of the Symposium on Electron-Beam-Testing, Nov. 9–10, 1984, Osaka, Japan, pages 69–72. The disclosed arrangement includes a magnetic objective lens having a short focal length in which is integrated a parallel plate analyzer composed of extraction and retarding field electrodes. It is not possible, however, with the disclosed spectrometer-objective to document angle-independent secondary electrons triggered at the specimen and emitted in a greater solid angle range. Thus, measuring errors result which limit the possible resolution of potential.

A spectrometer-objective comprising an integrated magnetic deflection system is disclosed in German Patent Application No. P 35 21 464.3 and corresponding U.S. patent application Ser. No. 874,498, filed June 16, 1986. For the disclosed arrangement, the deflection of the primary electron beam is within the spectrometer-objective so that the space required in conventional scanning electron microscopes for two-stage deflection systems between the condenser lens and the objective lens is eliminated, and the influence of the lateral Boersch effect on the probe diameter is reduced. Since both the primary electrons and the secondary electrons which are accelerated in the direction of the retarding field electrode are deflected in the field of the integrated deflection unit, an angle-independent documentation is generally possible only for particles emitted in the direction of the symmetry axis of the secondary electron lobe.

SUMMARY OF THE INVENTION

An object of the present invention is to provide a spectrometer-lens having a deflection unit integrated into an objective lens without modification of the documentation sensitivity for secondary particles. In particular, secondary particles are not deflected in the field of the deflection unit. Furthermore, an angle-independent documentation of secondary particles is guaranteed without deflection of the primary beam.

These and other objects are achieved in a spectrometer-lens having a single-stage deflection unit with at least one electrical deflection element and at least one magnetic deflection element generating electrical and magnetic deflection fields oriented nearly perpendicularly relative to one another and nearly perpendicular to a velocity vector of the secondary particles. The field strengths of the crossed electrical and magnetic deflection fields are matched so that a quotient of their respective amplitudes is approximately constant and equal to the velocity of the secondary particles.

An advantage is obtained with the present invention in that the spatial resolution and the resolution of potential in a particle beam measuring unit is noticeably enhanced even for high probe currents, for example, in an electron beam measuring unit. Moreover, the documentation sensitivity of the detector system for the secondary particles is guaranteed not to deteriorate due to the integration of the deflection unit within the spectrometer-lens.

Further embodiments and developments of the present invention include the provision of a hollow cylinder concentrically disposed relative to the optical axis of the spectrometer-lens and having surface portions thereof formed by electrodes of the electrical deflection element. The electrical deflection element is, in one embodiment, an electrostatic octopole deflector, while the magnetic deflection element includes at least two saddle coil pairs symmetrically disposed relative to the optical axis. The saddle coils can form portions of the hollow cylinder, and preferably have windings arranged in either a sine or cosine distribution per angle unit in a plane perpendicular to the optical axis. A further development is that the hollow cylinder is subdivided into three portions, a first of which is terminated in a first electrode arrangement, a middle portion is formed of the electrical deflection element composed of a plurality of electrodes at different potentials, and a third portion is terminated by a second electrode arrangement.

Alternate embodiments include providing the second electrode arrangement disposed either completely within the objective lens or above the objective lens. The second electrode arrangement preferably comprises two electrodes forming surface portions of concentric spheres centered on a secondary particle focusing point on the optical axis. The detector is preferably annular and concentrically disposed relative to the optical axis, and a grid electrode is preferably disposed between the second electrode arrangement and the detector.

BRIEF DESCRIPTION OF THE DRAWINGS

FIG. 2 is a horizontal cross section through an arrangement of electrostatic deflection elements from the embodiment of FIG. 1;

FIG. 3 is a horizontal cross section through a deflection unit for use in the embodiment of FIG. 1 and including the electrostatic deflection elements of FIG. 2;

DESCRIPTION OF THE PREFERRED EMBODIMENTS

Figure 1:
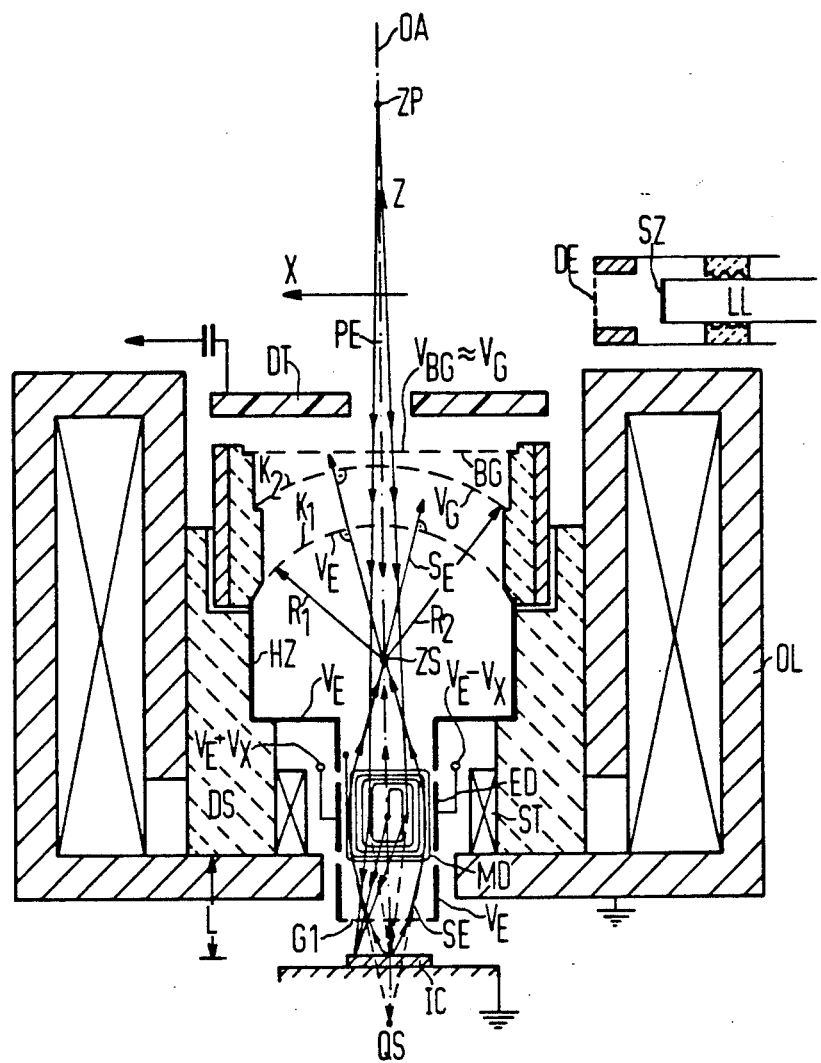
FIG. 1 is a vertical cross section of a spectrometer-lens according to the principles of the present invention.

An exemplary embodiment of a spectrometer-lens for electron beam metrology is shown in FIG. 1. The spectrometer-lens includes a short focal length, largely asymmetrical objective lens OL having an integrated electrostatic retarding field spectrometer and a single-stage deflection unit DS within the objective lens OL symmetrically disposed relative to an optical axis OA. The system composed of the objective lens OL, the spectrometer and the deflection unit DS forms a component part of an electron-optical column of an electron beam measuring unit with which primary electrons PE emanating from a high-current electron source are focused and deflected and with which secondary electrons SE that are triggered at a specimen IC are imaged to an intermediate point, or focusing point, ZS lying on the optical axis OA. The specimen IC, for example, is an integrated circuit. For generating a fine electron probe having a small probe diameter, for example, a probe diameter $d_{PE} \leq 0.1$ μm, the electron source or an intermediate image ZP of the electron source, demagnified by a condenser lens, is imaged again demagnified, onto the specimen IC with the assistance of the spectrometer-lens. The specimen IC is arranged in the immediate proximity of the rear focal plane of the objective lens OL.

The primary electron beam PE is directed onto a point (not shown in detail) of the specimen IC or, respectively, is scanned line-by-line over the specimen IC surface with the assistance of the deflection unit DS. The deflection unit DS is formed of magnetic deflection elements MD and electrical deflection elements ED. The main deflection plane of the deflection unit DS roughly coincides with the principal plane of the spectrometer-lens at the image side.

Since only the primary electrons PE and not the secondary electrons SE extracted from the specimen IC are to be subjected to deflection, the electrical and magnetic deflection fields generated by the deflection unit DS within the objective lens OL must be three-dimensionally oriented relative to one another in the fashion of a Wien filter and uniform over a greater spatial region such that their field vectors $\vec{E}$ or, respectively, $\vec{B}$ and the velocity vector $\vec{v}_{SE}$ of the secondary electrons SE in the region of the deflection unit are respectively nearly perpendicular relative to one another. A Lorentz force which acts on the secondary electrons SE in the field of the deflection unit DS, however, only disappears when the quotient of the quantity $|\vec{E}|$ of the electrical field strength and the quantity $|\vec{B}|$ of the magnetic field strength is constant and equal to the quantity $|\vec{v}_{SE}|$ of the velocity of the secondary electrons SE.

Low energy secondary electrons SE, in other words, those having a mean kinetic energy $\overline{E}_{SE} < 50$ eV, which are triggered at the point of incidence of the primary electron beam PE and emitted in a great solid angle range (the cosine distribution of the emission angle) above the specimen IC, are documented by extraction in the electrical field of a grid electrode G1 and accelerated in the direction of the optical axis OA. The grid electrode G1 lies at a high positive extraction potential $V_E$ of between 0.5 and 5 kV, and in one example, is at 2 kV. The secondary electrons SE are high energy electrons ($E_{SE} = 0.5 - 5$ keV) after traversing the planar grid electrode G1 which is disposed immediately above the specimen IC, the secondary electrons SE then proceeding into the focusing magnetic field of the objective lens OL. The secondary electrons SE are imaged at the intermediate image point ZS lying on the optical axis OA within the spectrometer-lens. The intermediate, or focusing, point ZS is to be interpreted as a real intermediate image of a virtual secondary electron source QS lying below the specimen IC. The virtual source point QS is defined by the smallest caustic cross section of all virtual secondary electron trajectories under the specimen IC. The position of the focusing point ZS is defined by the height of the extraction voltage $V_E$ and by the magnetic field strength between pole shoes of the objective lens OL which is dependent on the primary electron energy. Focusing of the secondary electrons SE in the field of the objective lens OL is only guaranteed by their acceleration to high kinetic energies ($E_{SE} = 0.5 - 5$ keV), since only then is the relative energy width $\Delta E/\overline{E}$ reduced to such a degree that the respective image distances, or range, of the secondary electrons SE emitted at the measuring point with different energies are nearly identical, $\overline{E}$ being equal to the mean kinetic energy of the secondary electrons SE. Since the primary electrons PE also traverse the objective lens OL which is at high extraction voltages $V_E$ with high energies, the disadvantageous influence of the lateral Boersch effect on the probe diameter is reduced at this portion of the electronoptical beam path.

For energy analysis of the secondary electrons SE, a spherically symmetrical electrical retarding field is provided either within or outside of the objective lens OL. The electrical opposing, or retarding, field is built up between two nearly hemispherical grid electrodes K1 and K2 established at different potentials. The center of the retarding field preferably coincides with the intermediate focusing point ZS. Hemispherical electrode arrangements are disclosed, for example, in U.S. Pat. No. 4,464,571. The lower grid electrode K1 lies at the same potential $V_E$ as the extraction electrode G1, and voltages $V_G$ of between $-15$ volts and $+15$ volts are typically applied to the upper grid electrode K2 acting as a retarding field electrode. A shielding grid electrode BG is also provided above the electrode arrangement K1 and K2 to build up the retarding field. The buffer grid BG is charged with a voltage $V_{BG}$ that is approximately the same as the voltage $V_G$ for the grid electrode K2.

For documenting the secondary electrons SE, an annular detector DT is disposed concentrically relative to the optical axis OA and is provided within the spectrometer-lens of the present invention. Semiconductor detectors, channel plates, or metal plates having electron traps are particularly suited for use as the annular detector DT. In addition to the annular detector DT, a second, conventional detector formed, for example, of an extraction electrode DE, a scintillator SZ, and a light pipe LL is also provided above the spectrometer-lens of one embodiment for documenting the secondary electrons SE emitted in the direction of the optical axis OA.

An angle-independent documentation of the secondary electrons SE is only guaranteed when the trajectories of the secondary electrons SE proceed parallel to the field lines of the electrical retarding field and, thus, perpendicular to the surfaces of the nearly hemispherical grid electrodes K1 and K2, such as when the primary beam PE is undeflected. When the virtual source point QS of the secondary electrons SE is imaged, or focused, at the center point ZS of the spherical retarding field, in other words at the common center of the spherically symmetrical grid electrodes K1 and K2 lying on the optical axis OA, then an angle-independent detection of the secondary electrons is accomplished. Simultaneously, the intermediate image ZS must lie at an adequate distance above the pole shoes and above the deflection unit DS in a field-free space to avoid Larmor orbits, or rotations, and the disturbances of the orbital motion of the secondary electrons SE after traversing the point ZS caused by the electrical fields. Focusing of the secondary electrons SE at the point ZS which lies on the optical axis OA above the deflection unit DS is thereby all the more possible for lower energies of primary electrons PE and a higher extraction potential $V_E$ at the grid electrode G1 to accelerate the secondary electrons SE.

To produce a space that is free of electrical fields in the region of the secondary electron intermediate image ZS, a hollow cylinder HZ is arranged symmetrically relative to the optical axis OA and within the objective lens OL. The hollow cylinder HZ acting as a Faraday cage is composed of three parts. An upper part of the hollow cylinder is tapered in the region of the pole shoes and is conductively connected to the spherically symmetrical grid electrode K1. A lower part of the hollow cylinder HZ partially extends from below the objective lens OL and is terminated by a planar extraction electrode G1 at the side directed toward the specimen IC. A central portion of the hollow cylinder HZ is an electrostatic octopole deflector. The electrostatic octopole deflector is integrated as part of the tubular hollow cylinder HZ by subdividing the central portion in the z-direction, as well as by subdividing the central portion azimuthally as shown in an exemplary embodiment in FIG. 2. Eight individual electrodes, or deflection elements, ED are formed, each having suitable potentials $V_i$, for $i=1$ to 8. An electrostatic dipole field having good homogeneity is formed in a plane extending perpendicular to the optical axis OA by the different potentials $V_i$ established at the electrical deflection elements ED. The potential at each electrical deflection element ED of the deflection unit DS is provided by the equation $$V_i = V_E + V_x \cos\theta_i + V_y \sin\theta_i \tag{1}$$

whereby i references the number of the $i^{th}$ electrode ED, $\theta_i$ references the azimuth angle of the center of the $i^{th}$ electrode ED, and $V_x$ and $V_y$ reference the time dependent deflection voltages along the respective x and y coordinate axes. To compensate for axial astigmatism, a stigmator ST is provided. When the electrodes ED of the octopole deflector are charged with suitable auxiliary voltages, the stigmator ST can be eliminated.

To avoid deflection of the secondary electrons SE that are accelerated to energies of $E_{kin} \approx eV_E$ in the field of the grid electrode K1, the electrical deflection field (which is oriented in the x-direction in FIG. 1) is superimposed on a magnetic deflection field (oriented in the y-direction in FIG. 1) that resides perpendicularly relative thereto. The field strengths $E_o$ and $B_o$ for the respective electrical and magnetic fields are matched to one another so that the Lorentz force acting on the secondary electrons SE is null. In other words, $E_o/B_o$ equals a constant.

The magnetic deflection element MD of the illustrated embodiment is a saddle coil system preferably in the form of a flexible conductor plate. Space saving saddle coils are known, for example, from the publication of K. H. Herrmann et al. "The Design of Compact Deflection Coils and their Application to a Minimum Exposure System", Proceedings of the 6th European Congress on Electron Microscopy (Jerusalem, 1976) pages 342–343. The saddle coils SPI and SPA are combined in pairs and, with a flexible foil, or sheet, F having interconnects LB (coil windings) embedded therein, are bent over the electrostatic deflection elements ED, as shown in FIG. 3. For reasons of clarity, an insulator lying between the electrostatic deflection elements ED and the magnetic deflection coils SPI and SPA is not shown in FIGS. 1 and 3. The distribution of windings LB within the coil system SPI and SPA is selected so that the magnetic deflection unit MD generates a magnetic field that is as uniform as possible in a plane lying perpendicular to the optical axis OA.

For the derivation of the matching, or balancing, condition for the entire deflection unit DS, an electrical deflection field along the optical axis OA is, for example, as follows:

$$\vec{E} = E_x(0,0,z)\vec{e}_x + E_y(0,0,z)\vec{e}_y \tag{2a}$$

and a magnetic deflection field along the optical axis OA is as follows:

$$\vec{B} = B_x(0,0,z)\vec{e}_x + B_y(0,0,z)\vec{e}_y \tag{2b},$$

the deflection unit DS being constructed in the fashion of a Wien filter. For such field distribution generated by the deflection unit DS, a Lorentz force of $$\vec{F} = q(\vec{E} + \vec{v} \times \vec{B}) \tag{3}$$

acts on charged particles having a charge q and a velocity $\vec{v}$. For electrons whose velocity has only one component in the z-direction ($\vec{v} = v_z \cdot \vec{e}_z$), the equation (3) is simplified to $$\vec{F} = -e\{[E_x(0,0,z) - v_z B_y(0,0,z)]\vec{e}_x + [E_y(0,0,z) + v_z B_x(0,0,z)]\vec{e}_y\} \tag{4}$$

The assumption $\vec{v} = v_z \vec{e}_z = v_{SE}\vec{e}_z$ is particularly true for secondary electrons SE that are extracted from the specimen IC in the field of the grid electrode K1 and accelerated in the direction of the optical axis OA which traverse the deflection field with nearly the same velocity (non-relativistic approximation)

$$v_{SE}=[2(E_o+eV_E)m^{-1}]^{\frac{1}{2}} \approx [2eV_Em^{-1}]^{\frac{1}{2}} \quad (5)$$

for starting energies $E_0 < 50$ eV, energy gains $eV_E$ in the field of the extraction electrode G1 typically amounts to $eV_E = 0.5$ to 5 kev. Secondary electrons SE that have a velocity $\vec{v} = v_{SE}\vec{e}_z$ do not experience any deflection in the field of the deflection unit DS when $\vec{F}_{SE}$ is zero. From equation (4), one thus obtains $$\vec{F}_{SE}=-e\{[E_x(0,0,z)-v_{SE}B_y(0,0,z)]e_x+[E_y(0,0,z)+v_{SE}B_x(0,0,z)]e_y\} \quad (6)$$

from which the matching, or balancing, condition $$E_x(0,0,z)/B_y(0,0,z)=v_{SE}$$

$$E_y(0,0,z)/B_x(0,0,z)=-v_{SE} \quad (7)$$

is derived.

For calculating the Lorentz force acting on a primary electron PE in an electric and magnetic deflection field according to equations (2a) and (2b), $v_z$ in equation (4) is replaced by $v_z = -v_{PE}$ where $$v_{PE}=[2e(V_B+V_E)m^{-1}]^{\frac{1}{2}} \quad (8),$$

whereby $eV_B$ indicates the energy of the primary electrons PE on the specimen IC and $e(V_B+V_E)$ indicates the energy of the primary electrons PE in the region of the deflection field. In consideration of a matching, or balancing, condition of equations (7) and (8), $$\vec{F}_{PE}=-e[1+(1+V_B/V_E)^{\frac{1}{2}}]\cdot[E_x(0,0,z)\vec{e}_x+E_y(0,0,-z)\vec{e}_y] \quad (9)$$

is obtained from equation (4). In other words, the deflection of the primary electrons PE is more than twice as great as in that for an electrostatic deflection field.

In FIG. 3, the deflection unit DS of the present invention is shown in cross section perpendicular to the optical axis OA. The deflection unit DS includes an electrostatic octopole deflector ED of FIG. 2, an insulator layer (not shown) and two saddle coil pairs SPI and SPA. The saddle coil pairs SPI and SPA are formed by a flexible printed circuit board F which completely embraces the cylindrical octopole deflector ED and are arranged concentrically relative to the optical axis OA. For generating a uniform magnetic deflection field B perpendicular to the optical axis OA, so that the generated magnetic deflection field B is uniform perpendicular to the optical axis OA, the saddle coils SPI and SPA preferably have a winding distribution $dN/d\theta$ for $$dN/d\theta = \text{const. } \cos \theta \text{ or, respectively,}$$

$$dN/d\theta = \text{const. } \sin \theta,$$

wherein $dN/d\theta$ references the number of windings per angle unit and $\theta$ references the azimuthal angle measured in a plane lying perpendicular to the optical axis OA. A magnetic deflection field B as generated by the outer saddle coil pair SPA is shown by the field lines in FIG. 3. The direction of current in the individual interconnects, or windings, LB is indicated, as usual, by crosses and points within the conductor cross sections. The inner coil pair SPI produces a similar field distribution, although in a direction perpendicular to the illustrated field.

Figure 4A:
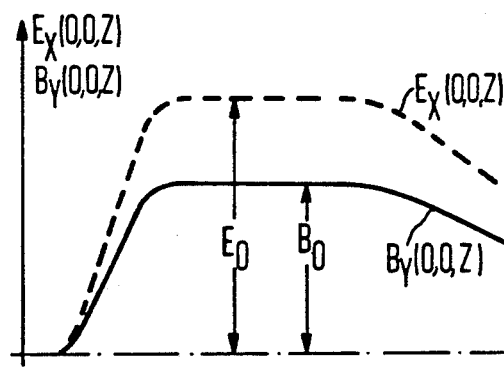
FIG. 4a is a graph of electrical and magnetic deflection field strengths along an optical axis of a spectrometer-lens of the present invention.
Figure 4B:
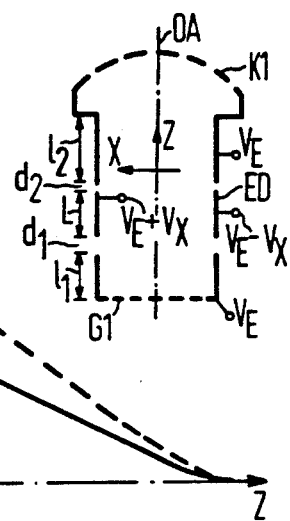
FIG. 4b is a schematic representation of the optical axis and adjoining spectrometer-lens elements along which the curve of FIG. 4a is taken.

The matching, or balancing, condition for the deflection unit DS constructed in the fashion of a Wien filter must be met not only for maximum values of the electrical and magnetic field strengths $E_o$ and $B_o$, but also must be met within the apparatus along the optical axis OA. With reference to FIG. 4a, the electrical deflection field $E_x (0,0,z)$, as well as the magnetic deflection field $B_y (0,0,z)$ drops more rapidly in the direction of the specimen IC than in the direction of the intermediate image ZS. The asymmetrical field curve in the direction of the optical axis OA is a result of the structure of the spectrometer-lens shown schematically in FIG. 4b, wherein the extraction network G1 and the lower spherical network K1 are at different spacings from the electrical deflection element ED, and the magnetic deflection element MD is arranged in the proximity of the pole shoes. For matching the electrical deflection field to a prescribed magnetic deflection field curve, distances $1_1$, $1_2$, and 1 of the respective three portions of the hollow cylinder HZ as shown schematically in FIG. 4b are arranged concentrically relative to the optical axis OA and/or their mutual spacings d1 and d2 are matched relative to one another such that the condition $$E_x(0,0,z)/B_y(0,0,z) \approx \text{const.} = E_o/B_o = v_{SE}(V_E)$$

is met.

An angle-independent documentation of the secondary electron SE is only approximately guaranteed when the primary electron beam PE is deflected, since the intermediate image ZS of the secondary electrons SE lies outside the optical axis OA in such cases due to the imaging properties of the objective lens OL. The intermediate image ZS, thus, no longer coincides with the center of the spherically symmetrical retarding field. A measuring error resulting from the dislocation of the secondary electron focusing image ZS is fundamentally incorrectable. The error is caused only by the field of the objective lens OL and is not a particular disadvantage in practice, especially for quantitative measurements of potential at nodes of an LSI circuit, since the specimen IC can be aligned precisely relative to the optical axis OA up to about one micrometer with the assistance of precision mechanical devices. It is still possible to undertake fine positioning of the primary electron beam PE onto a measuring point with the deflection unit DS when only small deflections are required and still provide an approximate coincidence of the intermediate image ZS of the primary electrons SE and the center of the spherically symmetrical retarding field. For reasons of clarity, only a secondary electron lobe generated by a non-deflected primary electron beam PE is shown in FIG. 1.

Figure 5:
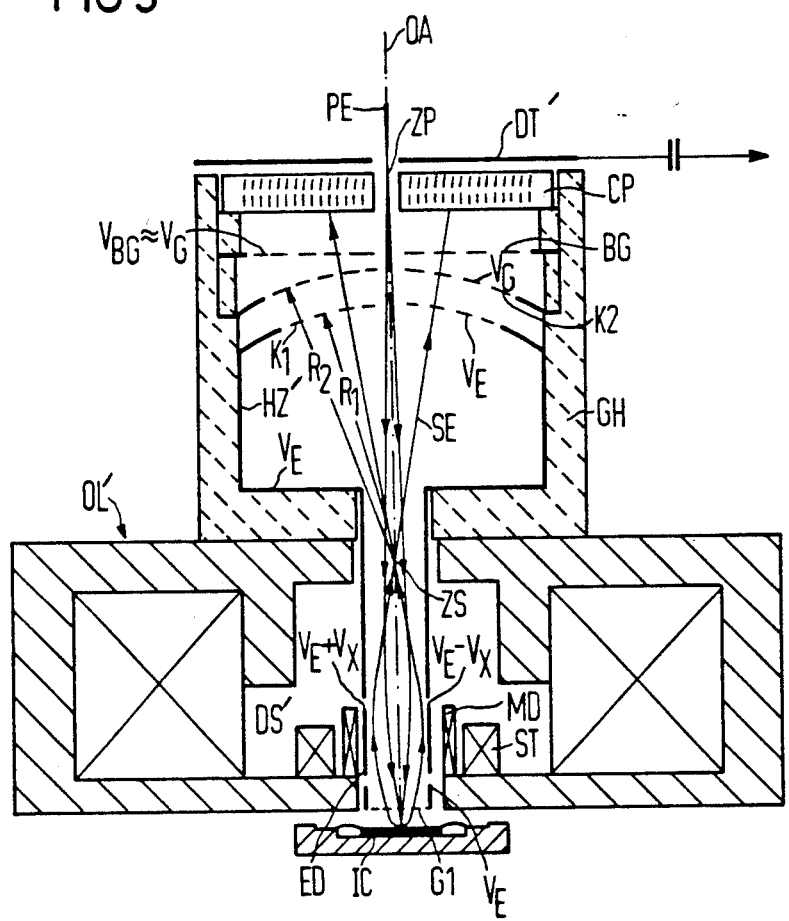
FIG. 5 is a second exemplary embodiment of a spectrometer-lens of the invention.

A preferred embodiment of a spectrometer-lens of the present invention is shown in FIG. 5 formed of a short focal length objective lens OL', a deflection unit DS' according to FIG. 3 arranged within the objective lens OL' symmetrically relative to the optical axis OA, and an electrostatic retarding field spectrometer. The system composed of the objective lens OL', the deflection unit DS', and a retarding field spectrometer forms components of the electron-optical column of an electron beam measuring unit with which primary electrons PE emitted by a high current electron source are focused and deflected, and with which secondary electrons SE triggered at a specimen IC are focused in an intermediate image ZS at the center of the spherically symmetrical retarding field lying on the optical axis OA. The electrical retarding field is generated with the assistance of the grid electrodes K1 and K2 arranged in a housing GH above the objective lens OL'. The grid electrodes K1 and K2, respectively, form surface portions of concentric spheres having different radii $R_1$ and $R_2$, where, for example, $R_1 \approx 30$ mm and $R_2 \approx 34$ mm. Since the center ZS of the spheres allocated to the grid electrodes K1 and K2 which define the center of the retarding field lies far above the deflection unit DS composed of the magnetic and electrical deflection elements MD and ED and far above the pole shoe gap, Larmor rotations of the secondary electrons SE are avoided after traversal of the intermediate image ZS. To produce a space free of electrical fields in the regions of the intermediate image ZS, a hollow cylinder HZ' is provided within the housing GH. The hollow cylinder HZ' is composed of three parts and is arranged symmetrically relative to the optical axis OA. The housing GH is closed by an annular secondary electron detector DT'. The buffer grid BG and a channel plate CP are also situated in the housing GH in addition to the grid electrodes K1 and K2. An upper portion of the hollow cylinder HZ' that is tapered in the region of the objective lens OL' is connected in conductive fashion to the grid electrode K1 that lies at a potential $V_E$. The lower part of the hollow cylinder HZ' is closed at the specimen side by the grid extraction electrode G1 which likewise lies at a potential $V_E$ of between 0.5 and 5 kV, and preferably at 2 kV. The middle cylindrical portion, as described above, is fashioned as an electrostatic octopole deflector ED in accordance with FIGS. 2 and is surrounded with a magnetic deflection element MD as shown in FIG. 3.

Although other modifications and changes may be suggested by those skilled in the art, it is the intention of the inventor to embody within the patent warranted hereon all changes and modifications as reasonably and properly come within the scope of his contribution to the art.

I claim as my invention:

1. A spectrometer-lens for particle beam apparatus, comprising:
   a magnetic lens means for focusing a primary particle beam onto a specimen to generate secondary particles;
   a spectrometer including
   a first electrode means for accelerating the secondary particles, and
   a second electrode means for decelerating the secondary particles, said second electrode means including two electrodes lying at different potentials said two electrodes being shaped to form surface portions of concentric spheres of different radii, centers of said concentric spheres of said two electrodes lying on a focus of the secondary particles; and
   a single stage deflection unit within said lens means having
   at least one electrical deflection means generating a nearly uniform electrical deflection field, and
   at least one magnetic deflection means generating a nearly uniform magnetic deflection field, said electrical and magnetic deflection fields being oriented relative to one another so that field vectors of said fields are at least nearly mutually perpendicular and at least nearly perpendicular to a velocity vector of the accelerated secondary particles, said electrical and magnetic deflection means generating field strengths matched to one another so that a quotient of the electrical field strength amplitude and the magnetic field strength amplitude is approximately constant and is equal to the amplitude of the velocity of the secondary particles after transversing said first electrode means.

2. A spectrometer-lens as claimed in claim 1, wherein said deflection unit is disposed within said lens means so that a main deflection plane of said deflection unit coincides with a principal plane of said lens means at an image side.

3. A spectrometer-lens as claimed in claim 1, wherein said at least one electrical deflection means includes a plurality of electrodes at mutually different potentials and disposed symmetrically relative to an optical axis of said lens means.

4. A spectrometer-lens as claimed in claim 1, further comprising:
   a hollow cylinder having a generated surface formed in part by electrodes of said at least one electrical deflection means, said hollow cylinder disposed concentrically relative to an optical axis of said lens means.

5. A spectrometer-lens as claimed in claim 1, wherein said at least one electrical deflection means is an electrostatic octopole deflector.

6. A spectrometer-lens as claimed in claim 1, further comprising:
   at least two saddle coil pairs disposed symmetrically relative to an optical axis of said lens means to form said at least one magnetic deflection means.

7. A spectrometer-lens as claimed in claim 1, further comprising:
   a hollow cylinder having a generated surface formed in part by individual saddle coils, said hollow cylinder being disposed concentrically relative to an optical axis of said lens means.

8. A spectrometer-lens as claimed in claim 6, wherein said saddle coils have windings embedded in a flexible sheet.

9. A spectrometer-lens as claimed in claim 6, wherein each of said saddle coils has a trigonometric distribution of windings per angle unit in a plane perpendicular to an optical axis of said lens means.

10. A spectrometer-lens as claimed in claim 9, wherein said trigonometric distribution is a sine distribution.

11. A spectrometer-lens as claimed in claim 9, wherein said trigonometric distribution is a cosine distribution.

12. A spectrometer-lens as claimed in claim 1, further comprising:
   a hollow cylinder disposed concentrically relative to an optical axis of said lens means, said hollow cylinder being subdivided into three portions by planes lying parallel to one another and perpendicular to said optical axis,
   a lower portion of said hollow cylinder at a specimen side being terminated by said first electrode means,
   a middle portion of said hollow cylinder forming said at least one electrical deflection means and formed of a plurality of electrodes established at different potentials, and an upper portion of said hollow cylinder being terminated by said second electrode means.

13. A spectrometer-lens as claimed in claim 12, wherein said at least one magnetic deflection means is disposed annularly at said middle portion of said hollow cylinder.

14. A spectrometer-lens as claimed in claim 12, wherein said lower portion and said middle portion and said upper portion of said hollow cylinder have respective lengths matched to a prescribed magnetic deflection field curve.

15. A spectrometer-lens as claimed in claim 1, wherein the electrical deflection field has a field distribution measured in the direction of an optical axis of said lens means matched to a prescribed magnetic deflection field curve.

16. A spectrometer-lens as claimed in claim 1, wherein said second electrode means is disposed completely within an objective lens.

17. A spectrometer-lens as claimed in claim 1, wherein said second electrode means is disposed above said lens means.

18. A spectrometer-lens as claimed in claim 1, further comprising:
an annular detector disposed concentrically relative to an optical axis of said lens and above said second electrode means so as to document the secondary particles.

19. A spectrometer-lens as claimed in claim 18, further comprising:
a grid electrode disposed between said second electrode means and said detector.

20. A spectrometer-lens as claimed in claim 1 wherein said centers of said concentric spheres of the two electrode means lie on an optical axis of said spectrometer-lens in a region free of electrical fields.

21. A spectrometer-lens for particle beam apparatus comprising:
a magnetic lens means for focusing a primary particle beam onto a specimen to generate secondary particles;
a spectrometer including
a first electrode means for accelerating the secondary particles, and
a second electrode means for decelerating the secondary particles; and
a single stage deflection unit within said lens means having
at least one electrical deflection means generating a nearly uniform electrical deflection field, and
at least one magnetic deflection means generating a nearly uniform magnetic deflection field, said electrical and magnetic deflection fields being oriented relative to one another so that field vectors of said fields are at least nearly mutually perpendicular and at least nearly perpendicular to a velocity vector of the accelerated secondary particles, said electrical and magnetic deflection means generating field strengths matched to one another so that a quotient of the electrical field strength amplitude and the magnetic field strength amplitude is approximately constant and is equal to the amplitide of the velocity of the secondary particles after traversing said first electrode means.

* * * * *